(12) United States Patent
Wu et al.

(10) Patent No.: US 7,409,630 B1
(45) Date of Patent: Aug. 5, 2008

(54) MODIFIED CHASE COMBINING FOR HYBRID AUTOMATIC REPEAT REQUEST

(75) Inventors: Jun Wu, San Diego, CA (US);
Wenzhong Zhang, San Diego, CA (US);
Yonggang Fang, San Diego, CA (US);
Keqiang Zhu, San Diego, CA (US);
Mary Chion, Belle Mead, NJ (US);
Irving Wang, Land O Lakes, FL (US)

(73) Assignee: ZTE (USA) Inc., Iselin, NJ (US)

( * ) Notice: Subject to any disclaimer, the term of this patent is extended or adjusted under 35 U.S.C. 154(b) by 528 days.

(21) Appl. No.: 11/165,439

(22) Filed: Jun. 22, 2005

Related U.S. Application Data

(60) Provisional application No. 60/584,060, filed on Jun. 29, 2004.

(51) Int. Cl.
*H03M 13/03* (2006.01)
(52) U.S. Cl. .................................... 714/790
(58) Field of Classification Search .............. 714/748, 714/751, 752, 790
See application file for complete search history.

(56) References Cited

U.S. PATENT DOCUMENTS 6,704,898 B1 * 3/2004 Furuskar et al. ............. 714/751

OTHER PUBLICATIONS

"Chase H-ARQ support for all FEC schemes," IEEE C802.16e-04/136 (Jun. 25, 2004), http://ieee802.org/16/tge/contrib/C80216e-04_136.pdf (accessed on Sep. 17, 2007), 18 pages.
"Part 16: Air Interface for Fixed and Mobile Broadband Wireless Access Systems—Amendment for Physical and Medium Access Control Layers For Combined Fixed and Mobile Operation in Licensed Bands", IEEE P802.16e/D3, pp. 1-161 (May 31, 2004).
"Part 16: Air Interface for Fixed Broadband Wireless Access Systems", IEEE P802.16-REVd/D5, pp. 1-915 (May 13, 2004).
"Part 16: Air Interface for Fixed Broadband Wireless Access Systems", IEEE Std 802.16-2004, pp. 1-895 (Oct. 1, 2004).
Cho et al., "New FEC structure suitable for CTC and mobile Cellular Operation of 802.16 OFDMA", IEEE C802.16d-04/23, pp. 1-25 (Mar. 11, 2004), http://www.ieee802.org/16/tgd/contrib/C80216d-04_23.pdf (accessed on Sep. 17, 2007).

* cited by examiner

*Primary Examiner*—Shelly A Chase
(74) *Attorney, Agent, or Firm*—Fish & Richardson P.C.

(57) ABSTRACT

Error correction techniques based on a modified chase combining (MCC) in data retransmission in communication systems such as wired and wireless communication systems. The described MCC may be implemented in wireless communication systems that use hybrid automatic repeat request (H-ARQ) in data transmission. In wireless systems, the mobile communications devices and base stations may be designed with the present MCC.

19 Claims, 4 Drawing Sheets

MODIFIED CHASE COMBINING FOR HYBRID AUTOMATIC REPEAT REQUEST

This application claims the benefit of U.S. Provisional Patent Application No. 60/584,060 entitled "MODIFIED CHASE COMBINING FOR HYBRID AUTOMATIC REPEAT REQUEST" and filed on Jun. 29, 2004, the entire disclosure of which is incorporated by reference as part of the specification of this application.

BACKGROUND

This application relates to communication systems and techniques including wireless communication systems and techniques.

Information may be represented by digital data bits and such data bits can be transmitted as data packets from a sender to one or multiple receivers. The transmission of such data bits may be made through various transmission links such as wired links (e.g. electrical cables and optical fibers) and wireless links (e.g., radio-frequency, microwave, or optical signals through air). Any perturbation between a sender and a receiver may adversely affect the signal and the data bits carried in the signal. Hence, the received data bits may be corrupted due to various perturbations during the transmission.

Various techniques may be used to reduce the errors in received data bits at a receiver. For example, the data bits from the sender may be encoded with redundancy bits for correcting bit errors prior to transmission and the encoded data bits are then transmitted to the receiver. The receiver decodes the received data bits, corrects any bit errors that may have occurred during the transmission based on the redundancy data bits, and retrieves the original data bits. The forward error correction (FEC) is a well-known implementation of this approach.

As another example, the receiver may check the bit errors in the received data bits and send a request for re-transmission to the sender if the data bits are corrupted. In this approach, the receiver may combine data bits of different transmissions by the sender to reduce the bit errors. In wireless communication systems, the automatic repeat request (ARQ) and hybrid ARQ (H-ARQ) are two implementation of this approach.

Different data combing techniques may be applied in H-ARQ in wireless communications. One example of the data combining techniques is the incremental redundancy (IR) retransmission where the data bits and some redundancy bits are transmitted first and the additional redundancy bits are incrementally transmitted subsequently upon requests by a receiver. The wireless air interfaces under IEEE P802.16-REVd/D5 (May 2004) provides an optional H-ARQ that uses the IR retransmission. The sections 6.3.17, MAC support for HARQ, in IEEE P802.16-REVd/D5 is incorporated herein by reference as part of the specification of this application. Jae-hee Cho et al. of Samsung Electronics in their publication of "New FEC structure suitable for CTC and mobile Cellular Operation of 802.16 OFDMA" on Mar. 11, 2004 described an implementation of the IR retransmission for OFDM/OFDMA wireless systems and is incorporated herein by reference as part of the specification of this application.

Another example of the data combining techniques is the chase combining (CC) retransmission where an identical duplicate of a previously transmitted data packet which is detected to have errors by a receiver is sent for the second or more times so that the receiver can combine the received duplicates to improve the signal quality prior to decoding. Section 8.495 under IEEE C802.16e-04/136 describes an implementation of CC retransmission in OFDM/OFDMA systems and is incorporated herein by reference as part of the specification of this application.

SUMMARY

This application includes error correction techniques in implementing a modified chase combining for data retransmission in communication systems. Various implementations are described.

In one implementation, for example, a method for data communication includes encoding a data packet to form an encoded forward error correction (FEC) data block, applying a first puncture pattern to the encoded FEC data block to form a first punctured FEC data block, transmitting the first punctured FEC data block over a transmission link to a receiver, checking the received first punctured FEC data block at the receiver to determine whether the data packet embedded in the received first punctured FEC data block has a uncorrectable error, requesting a retransmission when there is at least one uncorrectable error in the data packet embedded in the received first punctured FEC data block, applying a second, different puncture pattern to the encoded FEC data block to form a second punctured FEC data block, transmitting the second punctured FEC data block over the transmission link to the receiver, combining the first and the second punctured FEC data blocks to form a combined data block, and decoding the combined data block to extract the embedded data packet.

In another implementation, a wireless communication system is described to include base stations spatially distributed to wirelessly communicate with subscriber devices and a retransmission mechanism operable to control each base station in communication with a subscriber device. The retransmission mechanism controls the base station to encode a data packet to form an encoded FEC data block, apply different puncture patterns to the encoded FEC data block to form different punctured FEC data blocks, wirelessly transmit a first punctured FEC data block to the subscriber device, wirelessly transmit a second punctured FEC data block to the subscriber device upon a request from the subscriber device when the data packet embedded in the received first punctured FEC data block has at least one uncorrectable error, and wirelessly transmit additional punctured FEC data blocks to the subscriber device upon additional requests.

These and other implementations and their operations are described in greater detail in the attached drawings, the detailed description, and the claims.

DETAILED DESCRIPTION

Figure 1:
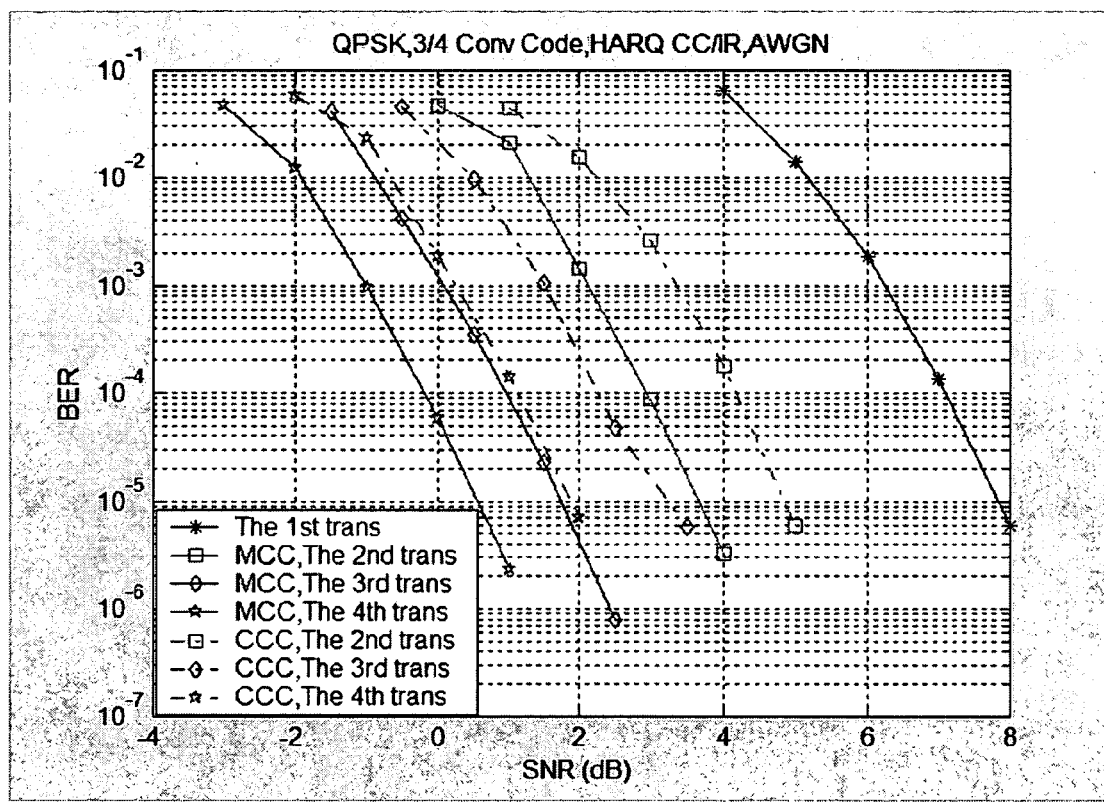
FIG. 1 shows a modified chase combining H-ARQ scheme performance over Additive White Gaussian Noise (AWGN).

This application describes, among others, data retransmission techniques based on a modified chase combining (MCC) for data retransmission in various communication systems including wired and wireless communication systems. For example, the described MCC may be applicable in different wireless communication systems, including but not limited to, CDMA systems such as various CDMA2000 standards (e.g., CDMA2000 1X, CDMA2000 1xEV-DO, and CDMA2000 1xEV-DV), TDMA systems such as GSM, and OFDM or OFDMA systems. The examples described here reference wireless communications systems to illustrate the features in the MCC and its implementations.

Wireless communication systems use electromagnetic waves in the radio frequency, microwave, and millimeter spectral ranges to provide communication services to wireless communication devices located within cells of coverage areas of the systems. Various perturbations may be present in wireless communications, e.g., signal fading caused by the transmission from a transmitter to a receiver. Such fading can vary with time and may degrade the bit error rate of the system, lead to loss of data, or even cause failure of a communication link. One common cause for such fading is the notorious multipath fading where a signal reaches a receiver in two or more different signals paths, e.g., a direct signal and a delayed reflection from one or more objects. The fading of the signal at the receiver may be caused by, e.g., the interference of such different signals originated from the same signal from the transmitter.

The MCC for data retransmission may be used to reduce the bit errors caused by the above signal fading and other perturbations during transmission of data in wireless systems and in other communication systems. The IR retransmission may be implemented with a complex decoding scheme with a lower code rate (i.e., the ratio of the input data bits and output data bits of the encoder) when each retransmission happens to provide robust correction for bit errors. Although the IR retransmission may provide a high diversity gain and additional channel coding gain with the complex decoding scheme, the execution of such complex decoding scheme may demand intensive processing. The chase combining (CC) retransmission achieves the same target with different approach using a much simpler decoding scheme, its coding rate will not change for each retransmission. Compared with IR, CC compromises the level of the error correcting capability with processing requirement.

The conventional Chase Combing (CCC) always retransmits the same FEC block for different retransmissions. Hence, for a high rate code, the punctured bit never have chance to be transmitted. The present Modified Chase Combining (MCC) method deviates from the conventional CC method to apply different puncture patterns to the encoded data bits to obtain different punctured data packets for different retransmissions, so each data bit will have chance to be transmitted. From the code rate point of view, the code rate is changed after the second transmission. At the receiver end, such different punctured bit metrics are depunctured using their corresponding puncture pattern and combined together to improve error correction in the decoding. This MCC method may be applied to various channel coding systems and is compatible with a non-punctured code which is simply a special case among all possible punctured patterns).

In one implementation of the MCC, the coded block or data packet varies from one retransmission to another. Different puncture patterns are used to create different FEC blocks for different retransmissions. The puncture patterns may be predefined and can be selected based on the number of the retransmission. At the receiver, the received signals are depunctured according to its specific puncture pattern which is decided by the current retransmission number, then the combination is performed at the bit metrics level. For example, a punctured bit position of a received FEC block may be filled with "0" and when added in the combination with other received FEC blocks with different puncture patterns, this punctured bit position is filled with a bit that is not punctured in another FEC block. Therefore, different from the conventional chase combining, the MCC can provide the additional coding gain without the cost of complexity.

Notably, the combined data block by combining different FEC blocks with different punctured patterns becomes a low rate code instead of a punctured code. This is because the puncture pattern changes from one retransmission to another. As a result, an additional coding gain can be obtained in comparison with the conventional chase combining (CCC). Our simulation results show an additional gain of nearly 1 dB over CCC in Additive White Gaussian Noise (AWGN) and a gain of about 2~3 dB in the uncorrelated Rayleigh fading channel.

In addition, the retransmission block length can be flexible or varies for different retransmissions by choosing the puncture patterns with different puncture lengths. The decoding complexity in the MCC is almost the same as CCC but is much lower than the IR retransmission. The present MCC is compatible with the CCC such as the Chase H-ARQ proposed for OFDM and OFDMA systems in Section 8.495 under IEEE C802.16e-04/136.

Furthermore, the implementation of the MCC is simple. For example, the Chase H-ARQ in Section 8.495 under IEEE C802.16e-04/136 may be easily modified to implement the MCC. Some of the modifications are: (1) modify the Table AAA to add the present MCC mode; (2) Add the following text:

6.4.17.1 Subpacket generation

When MCC mode is defined, the FEC encoder is responsible for generating subpackets based on the predefined puncture pattern. The subpacket are combined by the receiver after de-puncturing.

(3) Modify the SPID in H_ARQ Control IE: delete reserved; (4) In other tables where Generic appears, add MCC mode; and (5) Add the puncturing pattern table for each rate and each SPID The present MCC may also implement a unique combining at the receiver end in processing the differently punctured FEC data blocks. The combining may be carried at the bit metrics level. The MCC receiver calculates the bit metrics (log likelihood ratio :LLR) for each transmission, then depunctures the bit metrics according to the specific puncture pattern. Next, the LLR is converted to the linear likelihood probability (LLP) and is combined for each bit. Finally the combined LLP is converted back into LLR as the input of channel decoder.

The above combining for the MCC is different from CCC. In CCC, the combining happens at the modulation symbol level since the retransmitted version is the same modulation symbol. In one implementation, the CCC receiver estimates the channel for each transmission and compensates the received signal with the estimated channel, then the compensated modulated symbols for different transmission can be coherently combined. This combining is also referred to as the Maximal Ratio Combination.

The performance of the present MCC was evaluated in a H-ARQ scheme for both AWGN and uncorrelated Rayleigh fading channel. The modulation is QPSK for the purpose of the evaluation and other modulation schemes may be used with the MCC. The channel coding scheme used in the evaluation is a ¾ punctured convolutional code, which is a puncture version from the ½ mother code. In the simulation, three retransmissions are evaluated, the puncture patterns for the total of 4 transmissions are

[1,0,1;1,1,0];

[0,1,1;1,0,1];

[1,1,0;0 1 1]; and

Figure 2:
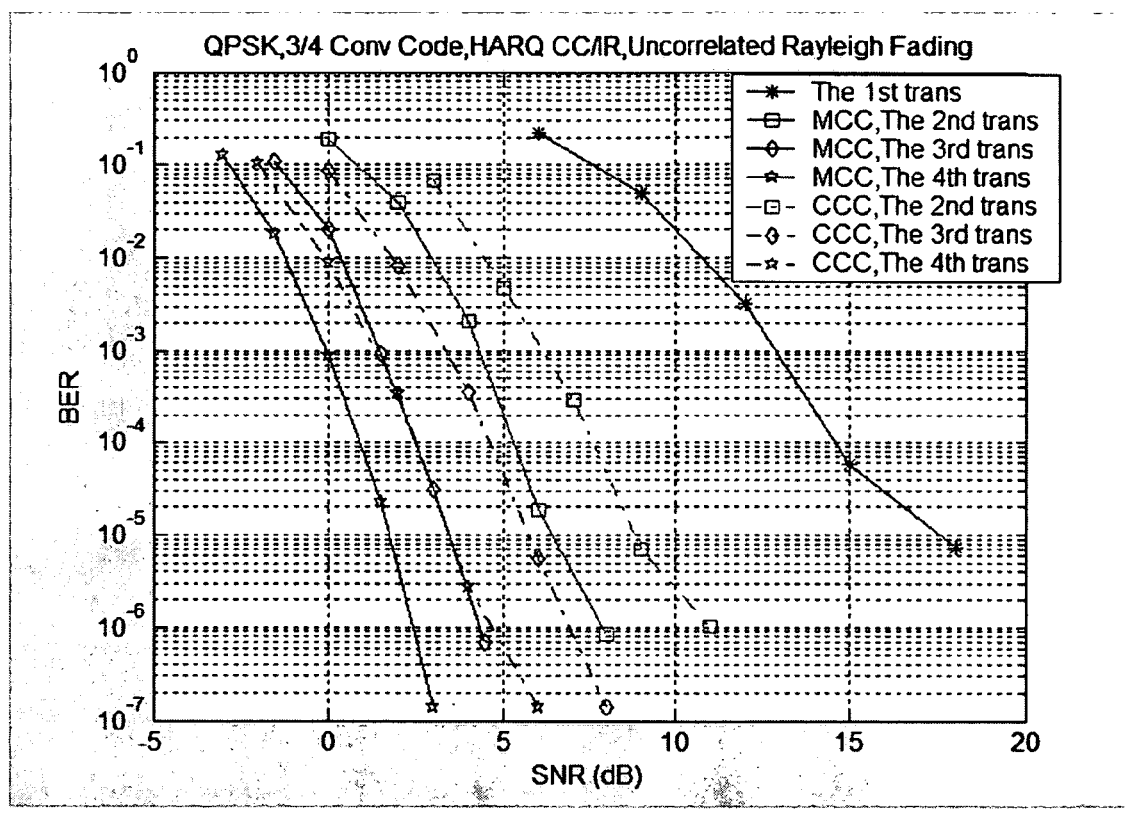
FIG. 2 shows the modified CC H-ARQ scheme performance over uncorrelated Rayleigh fading.

FIGS. 1 and 2 show the simulation results. The simulation results suggest that the MCC has almost 1 dB gain compared to conventional CC H-ARQ over AWGN. In Rayleigh fading channel, the gain is higher and is about 3 dB.

The above MCC may be used in different wireless communication systems, including but not limited to, CDMA systems such as various CDMA2000 standards (e.g., CDMA2000 1X, CDMA2000 1xEV-DO, and CDMA2000 1xEV-DV), TDMA systems such as GSM, and OFDM or OFDMA systems.

Figure 3:
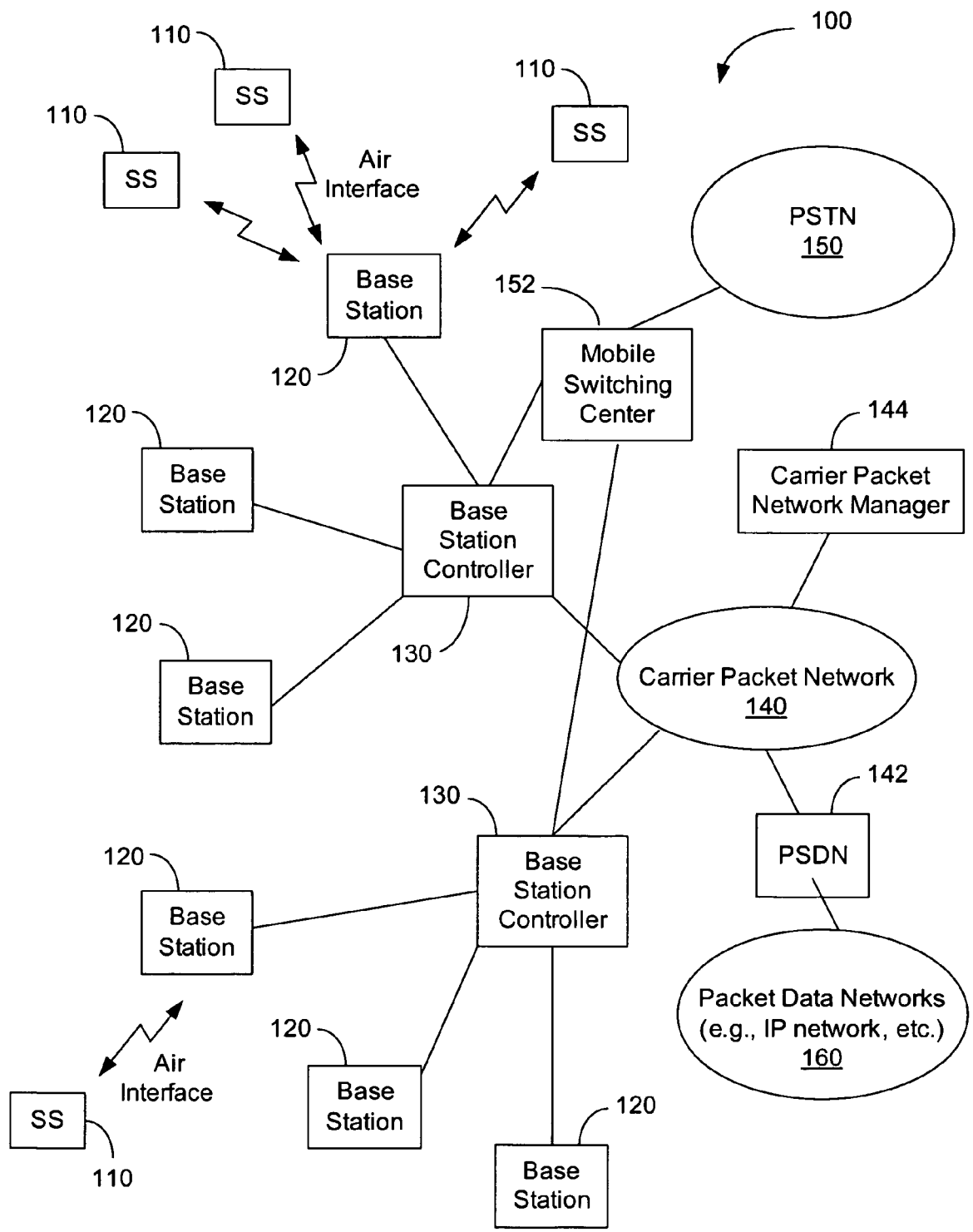
FIG. 3. An exemplary wireless system for implementing the modified chase combining (MCC).

As an example, FIG. 3 illustrates an exemplary wireless communication system 100 that uses communication channels at different frequencies under OFDM or OFDMA to provide wireless communication services with the adaptive transmit diversity described here. The system 100 may include a network of base stations (BSs) or base station transceivers 120 that are spatially distributed in a service area to form a radio access network for wireless subscriber or subscriber stations (SSs) 110. In some implementations, a base station 120 may be designed to have directional antennas and to produce two or more directional beams to further divide each cell into different sections. Base station controllers (BSCs) 130 are connected, usually with wires or cables, to BSs 120 and control the connected BSs 120. Each BSC 130 is usually connected to and controls two or more designated BSs 120.

The wireless system 100 may include a carrier packet network 140 that may be connected to one or more public switched telephone networks (PSTN) 150 and one or more packet data networks 160 (e.g., an IP network). A mobile switching center (MSC) 152 may be used as an interface between the BSCs 130 and the PSTN 101. A packet data serving node 142 may be used to provide an interface between the carrier packet network 140 and the packet data network 160. In addition, a carrier packet network manager 144 may be connected to the carrier packet network 140 to provide various network management functions, such as an AAA server for authentication, authorization, and accounting (AAA) functions.

Each subscriber station 110 may be a stationary or mobile wireless communication device. Examples of a stationary wireless device may include desktop computers and computer servers. Examples of a mobile wireless device may include mobile wireless phones, Personal Digital Assistants (PDAs), and mobile computers. A subscriber station 110 may be any communication device capable of wirelessly communicating with base stations 120.

The system in FIG. 3 may be applied to the communication bands from 2 to 11 GHz under OFDM and OFDMA provided in IEEE 802.16d (January, 2004). In OFDM and OFDMA systems, the available frequency band is divided into subcarriers at different frequencies that are orthogonal. In an OFDMA system, a subchannel is formed from a subset of subcarriers. In OFDMA, a total of 32 sub channels are allocated to each radio cell.

The MCC may be implemented in both the mobile communication devices (e.g., the subscriber stations) and the base stations in wireless systems such as CDMA, TDMA, OFDM/OFDMA and other mobile systems and in a transceiver communication device in other communication applications.

Figure 4:
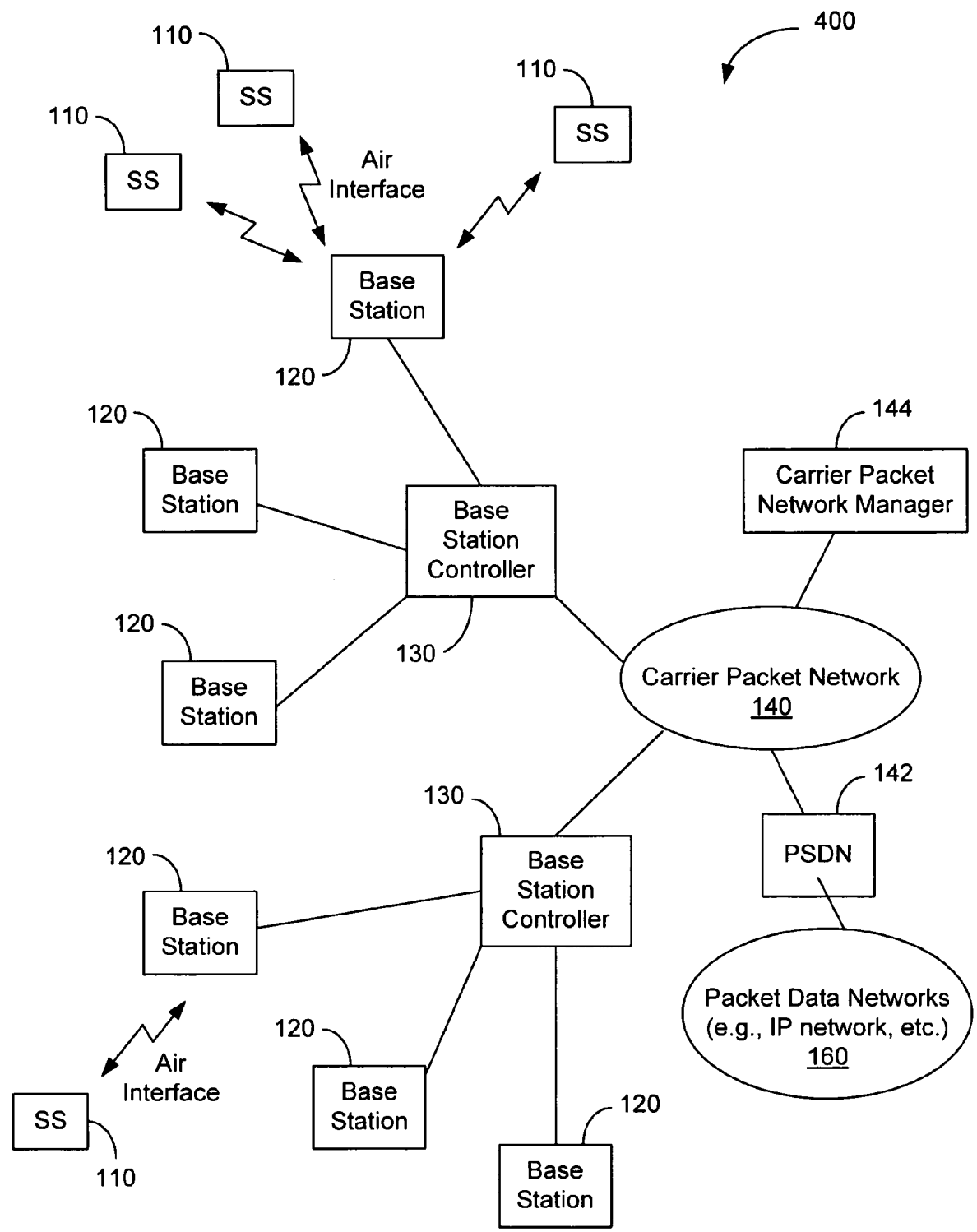
FIG. 4 shows another example of a wireless system based on orthogonal frequency division multiplexing (OFDM) or orthogonal frequency division multiple access (OFDMA) for implementing the MCC.

As an example, FIG. 4 illustrates an exemplary wireless communication system 400 that uses communication channels at different frequencies to provide wireless communication services based on OFDM and ODFMA and can be used to implement the present error correction techniques. OFDM and OFDMA systems generate different channels within a given band by using the orthogonal frequency division multiplexing to generate channel spectral profiles that are orthogonal to one another without interference when different channels are centered at selected equally-spaced frequencies. Under the OFDM, the frequency spacing can be smaller than the minimum spacing in conventional channels and hence increase the number of channels within a given band. The existing and developing specifications under IEEE 806.16x standards support wireless communications under OFDM and orthogonal frequency division multiple access (OFDMA). The drafts for IEEE 806.16e published in January 2004 (revision D3) and revised in May 2005 (revision D8) provide technical specifications for OFDM and OFDMA wireless systems.

Only a few implementations are disclosed. However, it is understood that variations and enhancements may be made.

What is claimed is:

1. A method for data communication, comprising:

encoding a data packet to form an encoded forward error correction (FEC) data block;

applying a first puncture pattern to the encoded FEC data block to form a first punctured FEC data block;

transmitting the first punctured FEC data block over a transmission link to a receiver;

checking the received first punctured FEC data block at the receiver to determine whether the data packet embedded in the received first punctured FEC data block has a uncorrectable error;

requesting a retransmission when there is at least one uncorrectable error in the data packet embedded in the received first punctured FEC data block;

applying a second, different puncture pattern to the encoded FEC data block to form a second punctured FEC data block;

transmitting the second punctured FEC data block over the transmission link to the receiver;

combining the first and the second punctured FEC data blocks to form a combined data block; and decoding the combined data block to extract the embedded data packet.

2. A method as in claim 1, wherein the transmission link comprises an electrical cable.

3. A method as in claim 1, wherein the transmission link comprises an optic fiber.

4. A method as in claim 1, wherein the transmission link comprises a wireless link.

5. A method as in claim 4, wherein the transmission link is part of a CDMA network.

6. A method as in claim 4, wherein the transmission link is part of a TDMA network.

7. A method as in claim 4, wherein the transmission link is part of a GSM network.

8. A method as in claim 4, wherein the transmission link is part of an OFDM network.

9. A method as in claim 4, wherein the transmission link is part of an OFDMA network.

10. A method for data communication, comprising:

encoding a data packet to form an encoded forward error correction (FEC) data block;

applying different puncture patterns to the encoded FEC data block to form different punctured FEC data blocks;

transmitting a first punctured FEC data block over a transmission link to a receiver;
checking the received first punctured FEC data block at the receiver to determine whether the data packet embedded in the received first punctured FEC data block has a uncorrectable error;
transmitting a second punctured FEC data block over the transmission link to the receiver when the data packet embedded in the received first punctured FEC data block has at least one uncorrectable error;
transmitting additional punctured FEC data blocks over the transmission link to the receiver upon additional requests from the receiver;
combining the first, the second and the additional punctured FEC data blocks to form a combined data block; and
decoding the combined data block to extract the embedded data packet.

11. A wireless communication system, comprising:
a plurality of base stations spatially distributed to wirelessly communicate with subscriber devices; and
a retransmission mechanism operable to control each base station in communication with a subscriber device to encode a data packet to form an encoded forward error correction (FEC) FEC data block;
apply different puncture patterns to the encoded FEC data block to form different punctured FEC data blocks;
wirelessly transmit a first punctured FEC data block to the subscriber device;
wirelessly transmit a second punctured FEC data block to the subscriber device upon a request from the subscriber device when the data packet embedded in the received first punctured FEC data block has at least one uncorrectable error; and
wirelessly transmit additional punctured FEC data blocks to the subscriber device upon additional requests.

12. A system as in claim 11, wherein the retransmission mechanism is operable to control each base station in communication with a subscriber device to:
wirelessly receive a first punctured FEC data block from the subscriber device to determine whether a data packet embedded in the received first punctured FEC data block has at least one uncorrectable error;
wirelessly request the subscriber device to resend the data packet when the data packet embedded in the received first punctured FEC data block has at least one uncorrectable error;
wirelessly receive an additional punctured FEC data block after wirelessly requesting the subscriber device for retransmission of the data packet, wherein the additional punctured FEC data block has a unique puncture pattern that is different from any other received punctured FEC data block;
combine the first, and the additional punctured FEC data blocks to form a combined data block; and
decode the combined data block to extract the embedded data packet.

13. A wireless communication device, comprising:
a transceiver terminal to wirelessly communicate with one or more base stations in a wireless communication system; and
a retransmission mechanism operable to control the transceiver terminal to encode a data packet to form an encoded forward error correction (FEC) FEC data block;
apply different puncture patterns to the encoded FEC data block to form different punctured FEC data blocks;
wirelessly transmit a first punctured FEC data block to the wireless communication system;
wirelessly transmit a second punctured FEC data block to the wireless communication system upon a request from the wireless communication system when the data packet embedded in the received first punctured FEC data block has at least one uncorrectable error;
wirelessly transmit additional punctured FEC data blocks to the wireless communication system upon additional requests.

14. A device as in claim 13, wherein the retransmission mechanism is operable to:
wirelessly receive a first punctured FEC data block from the wireless communication system to determine whether a data packet embedded in the received first punctured FEC data block has at least one uncorrectable error;
wirelessly request the wireless communication system to resend the data packet when the data packet embedded in the received first punctured FEC data block has at least one uncorrectable error;
wirelessly receive an additional punctured FEC data block after wirelessly requesting the wireless communication system for retransmission of the data packet, wherein the additional punctured FEC data block has a unique puncture pattern that is different from any other received punctured FEC data block;
combine the first, and the additional punctured FEC data blocks to form a combined data block; and
decode the combined data block to extract the embedded data packet.

15. A communication device, comprising:
a transceiver terminal to communicate with another communication device; and
a retransmission mechanism operable to control the transceiver terminal to encode a data packet to form an encoded forward error correction (FEC) data block;
apply different puncture patterns to the encoded FEC data block to form different punctured FEC data blocks;
transmit a first punctured FEC data block out of the different punctured FEC data blocks to the other communication device;
transmit a second punctured FEC data block out of the different punctured FEC data blocks to the other communication device upon a request from the other communication device when the data packet embedded in the received first punctured FEC data block has at least one uncorrectable error;
transmit additional punctured FEC data blocks to the other communication device upon additional requests.

16. A device as in claim 15, wherein the retransmission mechanism is operable to:
receive a first punctured FEC data block from the other communication device to determine whether a data packet embedded in the received first punctured FEC data block has at least one uncorrectable error;
request the other communication device to resend the data packet when the data packet embedded in the received first punctured FEC data block has at least one uncorrectable error;
receive an additional punctured FEC data block after requesting the other communication device for retransmission of the data packet, wherein the additional punctured FEC data block has a unique puncture pattern that is different from any other received punctured FEC data block;

combine the first, and the additional punctured FEC data blocks to form a combined data block; and decode the combined data block to extract the embedded data packet.

17. A device as in claim 15 or 16, wherein the transceiver terminal is connected to an electrical cable that is connected to the other communication device.

18. A device as in claim 15 or 16, wherein the transceiver terminal is connected to an optical fiber that is connected to the other communication device.

19. A device as in claim 15 or 16, wherein the transceiver terminal wirelessly communicates with the other communication device.

* * * * *

UNITED STATES PATENT AND TRADEMARK OFFICE
CERTIFICATE OF CORRECTION

| | | |
|---|---|---|
| PATENT NO. | : 7,409,630 B1 | Page 1 of 1 |
| APPLICATION NO. | : 11/165439 | |
| DATED | : August 5, 2008 | |
| INVENTOR(S) | : Jun Wu et al. | |

It is certified that error appears in the above-identified patent and that said Letters Patent is hereby corrected as shown below:

Column 6, line 33, (Claim 1) delete "a" and insert --an--;

Column 7, line 5, (Claim 10) delete "a" and insert --an--;

Column 7, line 25, (Claim 11) after "error correction (FEC)" delete "FEC";

Column 7, line 64, (Claim 13) after "error correction (FEC)" delete "FEC"

Signed and Sealed this

Twenty-first Day of October, 2008

JON W. DUDAS
*Director of the United States Patent and Trademark Office*